(12) United States Patent
Shiono et al.

(10) Patent No.: US 7,504,196 B2
(45) Date of Patent: Mar. 17, 2009

(54) POSITIVE RESIST COMPOSITION, METHOD FOR RESIST PATTERN FORMATION AND COMPOUND

(75) Inventors: Daju Shiono, Kawasaki (JP); Taku Hirayama, Kawasaki (JP); Hideo Hada, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 11/884,748

(22) PCT Filed: Feb. 9, 2006

(86) PCT No.: PCT/JP2006/302271

§ 371 (c)(1), (2), (4) Date: Aug. 17, 2007

(87) PCT Pub. No.: WO2006/090591

PCT Pub. Date: Aug. 31, 2006

(65) Prior Publication Data

US 2008/0145784 A1  Jun. 19, 2008

(30) Foreign Application Priority Data

Feb. 25, 2005 (JP) .............................. 2005-050721

(51) Int. Cl.
*G03F 7/004* (2006.01)
*G03F 7/30* (2006.01)

(52) U.S. Cl. .................... 430/270.1; 430/326; 430/905; 525/480

(58) Field of Classification Search ............. 430/270.1, 430/905, 910, 326; 525/480
See application file for complete search history.

(56) References Cited

U.S. PATENT DOCUMENTS

| | | | |
|---|---|---|---|
| 6,037,098 A | 3/2000 | Aoai et al. | |
| 6,106,993 A | 8/2000 | Watanabe et al. | |

FOREIGN PATENT DOCUMENTS

| | | |
|---|---|---|
| JP | 06266109 | 9/1994 |
| JP | 11167199 | 6/1999 |
| JP | 2002099088 | 4/2002 |
| JP | 2002099089 | 4/2002 |

OTHER PUBLICATIONS

International Search Report from PCT/JP2006/302271, mailed on Mar. 7, 2006.
Office Action issued on Jun. 5, 2008 on the counterpart Korean Patent Application No. 10-2007-7019433.

*Primary Examiner*—John S Chu
(74) *Attorney, Agent, or Firm*—Knobbe, Martens, Olson & Bear, LLP

(57) ABSTRACT

A positive resist composition that includes a base material component (A) that contains an acid-dissociable, dissolution-inhibiting group and exhibits increased alkali solubility under the action of acid, and an acid generator component (B) that generates acid upon exposure, wherein the base material component (A) contains a compound (A1), in which either a portion of, or all of, hydrogen atoms of phenolic hydroxyl groups within a polyhydric phenol compound, which has two or more phenolic hydroxyl groups, a molecular weight of 300 to 2,500, and is represented by a general formula (I) shown below, have been substituted with an acid-dissociable, dissolution-inhibiting group (II) represented by a general formula (II) shown below.

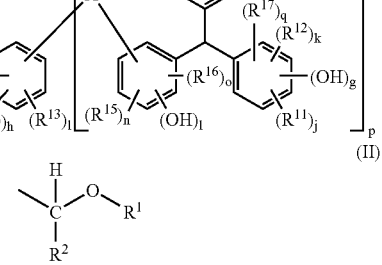

5 Claims, No Drawings

POSITIVE RESIST COMPOSITION, METHOD FOR RESIST PATTERN FORMATION AND COMPOUND

RELATED APPLICATIONS

This application is the U.S. National Phase filing under 35 U.S.C. §371 of PCT/JP2006/302271, filed Feb. 9, 2006, which designated the United States and was published in a language other than English, which claims priority under 35 U.S.C. §119(a)-(d) to Japanese Patent Application No. 2005-050721, filed Feb. 25, 2005. The content of these applications is incorporated herein by reference in their entireties.

TECHNICAL FIELD

The present invention relates to a positive resist composition, a method for resist pattern formation that uses the positive resist composition, and a compound that is ideal for use within the positive resist composition.

BACKGROUND ART

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source. Conventionally, ultra violet radiation typified by g-line and i-line radiation has been used, but nowadays, mass production of semiconductor elements using KrF excimer lasers and ArF excimer lasers has commenced. Furthermore, investigation is also being conducted into radiation with even shorter wavelengths than these excimer lasers, including $F_2$ excimer lasers, electron beams, EUV (extreme ultra violet), and X-rays.

Furthermore, one example of a known pattern-forming material capable of forming a pattern of minute dimensions is a chemically amplified resist, which includes a base material component with a film-forming capability, and an acid generator component that generates an acid upon exposure. Chemically amplified resists include negative resists, which undergo a reduction in alkali solubility on exposure, and positive resists, which exhibit increased alkali solubility on exposure.

Conventionally, polymers have been used as the base material components within these types of chemically amplified resists, and examples of these polymers include polyhydroxystyrene (PHS), PHS-based resins in which a portion of the hydroxyl groups of PHS have been protected with acid-dissociable, dissolution-inhibiting groups, copolymers derived from (meth)acrylate esters, and resins in which a portion of the carboxyl groups within these (meth)acrylate esters have been protected with acid-dissociable, dissolution-inhibiting groups.

However, when a pattern is formed using these types of pattern-forming materials, a problem arises in that roughness can develop on the upper surface and side wall surfaces of the pattern. For example, roughness on the side wall surfaces of a resist pattern, so-called line edge roughness (LER), can cause distortions around the holes in hole patterns, and fluctuations in the line width in line and space patterns, and consequently has the potential to adversely affect the formation of very fine semiconductor elements.

This problem becomes more significant as the pattern dimensions are reduced. Accordingly, in lithography processes using electron beams or EUV or the like, which are targeting the formation of very fine patterns with dimensions of several dozen nm, very low levels of roughness that are superior to current levels of pattern roughness are being demanded.

However, the polymers typically used as base materials have a large molecular size (or root mean squared radius per molecule) of several nm. In the developing step of a pattern formation process, the solubility behavior of the resist with respect to the developing solution typically occurs in single molecule units of the base material component, meaning that as long as polymers are used as the base material component, further reductions in the level of roughness will remain extremely difficult to achieve.

In order to overcome this type of problem, resists that employ a low molecular weight material as the base material component have been proposed as potential materials for achieving lower levels of roughness. For example, patent references 1 and 2 propose low molecular weight materials that include alkali-soluble groups such as hydroxyl groups, wherein either a portion of, or all of, these groups have been protected with acid-dissociable, dissolution-inhibiting groups. These low molecular weight materials have small molecular sizes as a result of their lower molecular weight, and as such, are expected to enable reductions in the level of roughness.

[Patent Reference 1]
Japanese Unexamined Patent Application, First Publication No. 2002-099088
[Patent Reference 2]
Japanese Unexamined Patent Application, First Publication No. 2002-099089

DISCLOSURE OF INVENTION

However, using these low molecular weight materials, the formation of high resolution patterns with reduced roughness, such as very fine patterns with dimensions of less than 90 nm, at a level that enables their practical application has proven very difficult. Problems include an inability to form a pattern at all (an inferior pattern-forming capability), or even if a pattern is able to be formed, an unsatisfactory reduction in the level of roughness, or an inability to satisfactorily maintain the pattern shape (a low pattern retention capability).

The present invention takes the above circumstances into consideration, with an object of providing a positive resist composition and a method for resist pattern formation that are capable of forming a high resolution resist pattern with a reduced level of roughness, as well as providing a compound that is ideal for use within the positive resist composition.

As a result of intensive investigation, the inventors of the present invention discovered that a compound prepared by protecting the phenolic hydroxyl groups of a polyhydric phenol compound having a specific structure and a specific molecular weight with a specific acid-dissociable, dissolution-inhibiting group was able to achieve the object described above, and they were therefore able to complete the present invention.

In other words, a first aspect of the present invention is a positive resist composition that includes a base material component (A) that contains an acid-dissociable, dissolution-inhibiting group and exhibits increased alkali solubility under the action of acid, and an acid generator component (B) that generates acid upon exposure, wherein the base material component (A) contains a compound (A1), in which either a portion of, or all of, the hydrogen atoms of phenolic hydroxyl groups within a polyhydric phenol compound, which has two or more phenolic hydroxyl groups, a molecular weight of 300 to 2,500, and is represented by a general formula (I) shown below, have been substituted with an acid-dissociable, dissolution-inhibiting group (II) represented by a general formula (II) shown below.

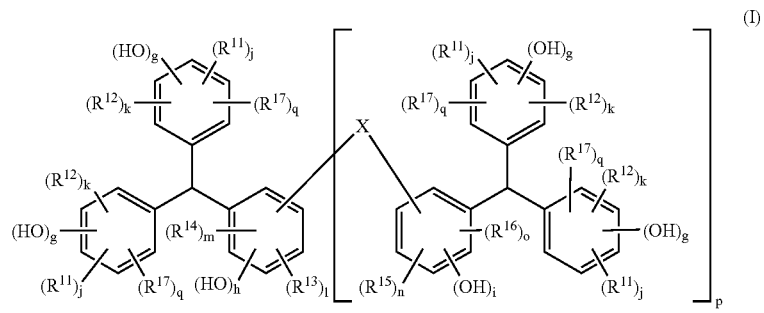

[In the formula (I), $R^{11}$ to $R^{17}$ each represent, independently, an alkyl group of 1 to 10 carbon atoms or an aromatic hydrocarbon group, which may include a hetero atom within the structure; g and j each represent, independently, an integer of 1 or greater, and k and q each represent, independently, either 0 or an integer of 1 or greater, provided that g+j+k+q is no greater than 5; h represents an integer of 1 or greater, and l and m each represent, independently, either 0 or an integer of 1 or greater, provided that h+l+m is no greater than 4; i represents an integer of 1 or greater, and n and o each represent, independently, either 0 or an integer of 1 or greater, provided that i+n+o is no greater than 4; p represents either 0 or 1; and X represents a group represented by a general formula (Ia) shown below.]

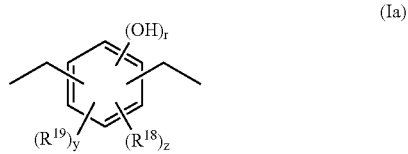

[In the formula (Ia), $R^{18}$ and $R^{19}$ each represent, independently, an alkyl group of 1 to 10 carbon atoms or an aromatic hydrocarbon group, which may include a hetero atom within the structure; and r, y and z each represent, independently, either 0 or an integer of 1 or greater, provided that r+y+z is no greater than 4.]

[In the formula (II), $R^1$ represents a straight-chain lower alkyl group of 1 to 5 carbon atoms, which may include a hetero atom within the structure; and $R^2$ represents a hydrogen atom or a lower alkyl group of 1 to 5 carbon atoms.]

Furthermore, a second aspect of the present invention is a method for resist pattern formation that includes the steps of: forming a resist film on a substrate using a positive resist composition according to the first aspect described above, conducting exposure of the resist film, and developing the resist film to form a resist pattern.

Furthermore, a third aspect of the present invention is a compound, wherein either a portion of, or all of, hydrogen atoms of phenolic hydroxyl groups within a polyhydric phenol compound, which has two or more phenolic hydroxyl groups, a molecular weight of 300 to 2,500, and is represented by a general formula (I) shown below, have been substituted with an acid-dissociable, dissolution-inhibiting group (II) represented by a general formula (II) shown below.

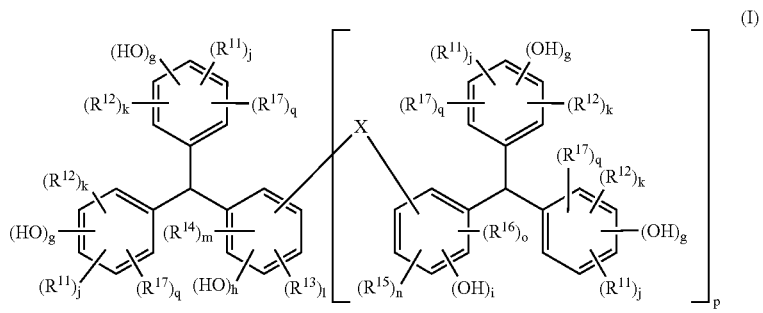

[In the formula (I), $R^{11}$ to $R^{17}$ each represent, independently, an alkyl group of 1 to 10 carbon atoms or an aromatic hydrocarbon group, which may include a hetero atom within the structure; g and j each represent, independently, an integer of 1 or greater, and k and q each represent, independently, either 0 or an integer of 1 or greater, provided that g+j+k+q is no greater than 5; h represents an integer of 1 or greater, and l and m each represent, independently, either 0 or an integer of 1 or greater, provided that h+l+m is no greater than 4; i represents an integer of 1 or greater, and n and o each represent, independently, either 0 or an integer of 1 or greater, provided that i+n+o is no greater than 4; p represents either 0 or 1; and X represents a group represented by a general formula (Ia) shown below.]

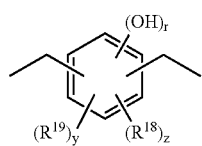

[In the formula (Ia), $R^{18}$ and $R^{19}$ each represent, independently, an alkyl group of 1 to 10 carbon atoms or an aromatic hydrocarbon group, which may include a hetero atom within the structure; and r, y and z each represent, independently, either 0 or an integer of 1 or greater, provided that r+y+z is no greater than 4.]

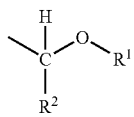

[In the formula (II), $R^1$ represents a straight-chain lower alkyl group of 1 to 5 carbon atoms, which may include a hetero atom within the structure; and $R^2$ represents a hydrogen atom or a lower alkyl group of 1 to 5 carbon atoms.]

In the present invention, the term "exposure" is a general concept that includes irradiation with any form of radiation.

According to the present invention, a positive resist composition and a method for resist pattern formation are provided that are capable of forming high resolution resist patterns with a reduced level of roughness, and a compound that is ideal for use within the positive resist composition is also provided.

BEST MODE FOR CARRYING OUT THE INVENTION

<<Compound>>

A compound of the present invention (hereafter referred to as the compound (A1)) is a compound in which either a portion of, or all of, the hydrogen atoms of phenolic hydroxyl groups within a polyhydric phenol compound (hereafter also referred to as the polyhydric phenol compound (I)), which has two or more phenolic hydroxyl groups, a molecular weight of 300 to 2,500, and is represented by a general formula (I) shown below, have been substituted with an acid-dissociable, dissolution-inhibiting group (II) represented by the general formula (II) shown above.

When the compound (A1) is blended into a resist composition together with an acid generator component (B) that generates acid upon exposure, the action of the acid generated from the acid generator component (B) by exposure causes the acid-dissociable, dissolution-inhibiting groups (II) within the compound (A1) to dissociate, thereby causing the entire compound (A1) to shift from an alkali-insoluble state to an alkali-soluble state.

-Polyhydric Phenol Compound (I)

In the general formula (I), $R^{11}$ to $R^{17}$ each represent, independently, a straight-chain, branched or cyclic alkyl group of 1 to 10 carbon atoms, or an aromatic hydrocarbon group.

The alkyl group is preferably a straight-chain or branched lower alkyl group of 1 to 5 carbon atoms, or a cyclic alkyl group of 5 to 6 carbon atoms. Examples of suitable lower alkyl groups include straight-chain or branched alkyl groups such as a methyl group, ethyl group, propyl group, isopropyl group, n-butyl group, isobutyl group, tert-butyl group, pentyl group, isopentyl group, and neopentyl group. Examples of suitable cyclic alkyl groups include a cyclohexyl group and cyclopentyl group.

The aromatic hydrocarbon group is preferably a group of 6 to 15 carbon atoms, and examples include a phenyl group, tolyl group, xylyl group, mesityl group, phenethyl group, and naphthyl group.

These alkyl groups or aromatic hydrocarbon groups may include a hetero atom such as an oxygen atom, nitrogen atom or sulfur atom within the group structure.

g and j each represent, independently, an integer of 1 or greater and preferably an integer from 1 to 2, and k and q each represent, independently, either 0 or an integer of 1 or greater, and preferably either 0 or an integer of 1 or greater but no greater than 2, provided that g+j+k+q is no greater than 5.

h represents an integer of 1 or greater and preferably an integer from 1 to 2, and l and m each represent, independently, either 0 or an integer of 1 or greater, and preferably either 0 or an integer of 1 or greater but no greater than 2, provided that h+l+m is no greater than 4.

i represents an integer of 1 or greater and preferably an integer from 1 to 2, and n and o each represent, independently, either 0 or an integer of 1 or greater, and preferably either 0 or an integer of 1 or greater but no greater than 2, provided that i+n+o is no greater than 4.

p is either 0 or 1, and is most preferably 1.

X is a group represented by the general formula (Ia) shown above.

In the formula (Ia), examples of the alkyl groups or aromatic hydrocarbon groups represented by $R^{18}$ and $R^{19}$ include the same groups as the alkyl groups or aromatic hydrocarbon groups exemplified above in relation to $R^{11}$ to $R^{17}$. Of these, from the viewpoint of achieving maximum effect for the present invention, $R^{18}$ and $R^{19}$ are preferably methyl groups.

r, y, and z each represent, independently, either 0 or an integer of 1 or greater, provided that r+y+z is no greater than 4. Of the various possibilities, r is preferably 1, and y+z is preferably 1.

Of the various possibilities, a compound (I-1) in which p is 1, $R^{11}$ is a lower alkyl group or a cycloalkyl group and j is 1, $R^{12}$ is a lower alkyl group and k is 1, and g is 1 is preferred as it enables the formation of a high resolution pattern with a reduced level of roughness. In particular (I-1) in which q, l, m, n and o are all 0, h and i are both 1, r is 1, $R^{18}$ is a lower alkyl group and z is 1, and y is 0 is particularly preferred.

Examples of the polyhydric phenol compound (I) include the compounds represented by formulas (I-11) and (I-12) shown below.

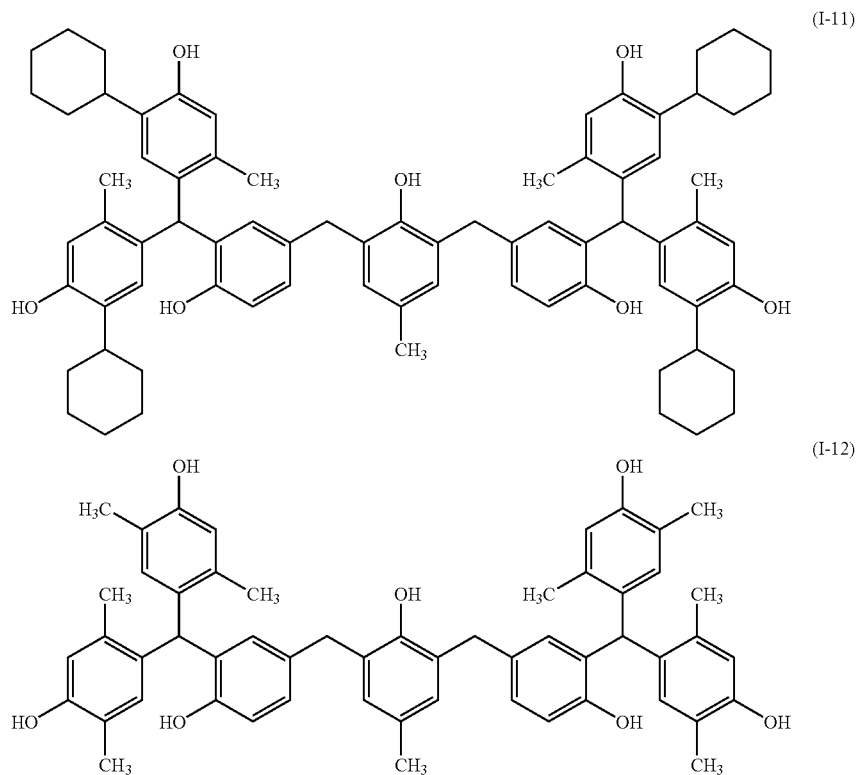

In the present invention, the molecular weight of the polyhydric phenol compound (I) must be within a range from 300 to 2,500, and this molecular weight is preferably from 450 to 1,500, and even more preferably from 500 to 1,200. By ensuring that the molecular weight falls within the above range, a pattern with a reduced level of roughness and excellent resolution can be formed. Furthermore, the shape of the resist pattern profile is also very favorable.

Furthermore, if the molecular weight dispersity (Mw/Mn) for the polyhydric phenol compound (I) is no higher than 1.5, then the effects of the present invention are further enhanced. It is thought that the reason for this observation is that provided the polyhydric phenol compound (I) has a narrow molecular weight distribution in which the dispersity is no more than 1.5, then even if the positive resist composition includes, as the compound (A1), a plurality of compounds in which different numbers of phenolic hydroxyl group hydrogen atoms have been substituted with acid-dissociable, dissolution-inhibiting groups (namely, different protection numbers), the alkali solubility of each of these compounds will still be comparatively uniform. Smaller dispersity values are preferred, and the dispersity value is even more preferably no more than 1.4, and is most preferably 1.3 or smaller.

Dispersity values are usually used for polydisperse compounds such as polymers, but even for monodisperse compounds, the existence of impurities such as production by-products or residual starting materials can result in the appearance of an apparent molecular weight distribution when analysis is conducted using gel permeation chromatography (GPC) or the like. In other words, in the case of a monodisperse compound, a dispersity of 1 indicates a degree of purity of 100%, and increasingly large dispersity values indicate larger quantities of impurities.

In the present invention, the molecular weight dispersity is calculated for compounds that exhibit the above type of apparent molecular weight distribution by measuring the weight average molecular weight (Mw) and the number average molecular weight (Mn) using a typical method used for the measurement of these Mw and Mn values for a polymer, such as a GPC method, and then determining the Mw/Mn ratio.

The dispersity can be adjusted either by removing reaction by-products and impurities following synthesis of the polyhydric phenol compound (I) that represents the targeted product, or by using conventional methods such as molecular weight fractionation treatments to remove the unneeded molecular weight fractions.

In the state where none of the phenolic hydroxyl group hydrogen atoms have been substituted with acid-dissociable, dissolution-inhibiting groups, the polyhydric phenol compound (I) must be a material that is capable of forming an amorphous (non-crystalline) film using a spin coating method.

Spin coating is one of the most commonly used methods for forming thin films, whereas an amorphous film refers to an optically transparent film that does not crystallize.

A judgment as to whether or not the polyhydric phenol compound (I) is capable of forming an amorphous film using spin coating is determined on the basis of whether or not a film formed by spin coating the compound onto an 8-inch silicon wafer is transparent across the entire film surface. More specifically, judgment can be conducted, for example, in the manner described below. First, the polyhydric phenol compound (I) is added to a solvent typically used as a resist solvent, such as a mixed solvent of ethyl lactate and propylene glycol monoethyl ether acetate in a ratio (weight ratio) of 40/60 (hereafter this solvent is abbreviated as EM), in sufficient quantity to generate a solution with a concentration of 14% by weight, and dissolution of the compound is achieved by ultrasound treatment (dissolution treatment) using an ultrasound cleaning apparatus. Subsequently, the resulting solution is spin coated onto a wafer at 1,500 rpm and subjected to optional drying and baking (PAB: Post Applied Bake) at 110° C. for 90 seconds, and a visual judgment is then made as to whether the formed film is transparent, thereby confirming whether or not an amorphous film has been formed. A non-transparent, cloudy film is not an amorphous film.

Moreover, the polyhydric phenol compound (I) preferably generates an amorphous film via the above method described that exhibits favorable stability, and for example, compounds for which the transparent state, namely the amorphous state, of the film is retained even after standing for 2 weeks at room temperature following the above PAB treatment are particularly desirable.

-Acid-Dissociable, Dissolution-Inhibiting Group (II)

In the formula (II), $R^1$ represents a straight-chain lower alkyl group of 1 to 5 carbon atoms, and examples of this lower alkyl group include a methyl group, ethyl group, n-propyl group, n-butyl group, isobutyl group and n-pentyl group.

The lower alkyl group of $R^1$ may include a hetero atom such as an oxygen atom, nitrogen atom or sulfur atom within the group structure. In other words, the lower alkyl group represented by $R^1$ includes straight-chain alkyl groups in which either a portion of, or all of, the hydrogen atoms may be substituted with a group that contains a hetero atom (including those cases where the hetero atom itself functions as the substituent group), and groups in which a portion of the carbon atoms of the alkyl group may be substituted with a hetero atom. Examples of suitable hetero atoms include an oxygen atom, sulfur atom, nitrogen atom, and fluorine atom. In the present invention, unless stated otherwise, the term "alkyl group" refers to a monovalent saturated hydrocarbon group.

A "group that contains a hetero atom" may be the hetero atom itself, or a group that contains the hetero atom and a carbon atom and/or hydrogen atom, such as an alkoxy group that contains a hetero atom.

Examples of alkyl groups in which either a portion of, or all of, the hydrogen atoms have been substituted with a hetero atom include fluorinated lower alkyl groups in which either a portion of, or all of, the hydrogen atoms have been substituted with fluorine atoms, groups in which two hydrogen atoms bonded to the same carbon atom have been substituted with a single oxygen atom (namely, groups containing a carbonyl group (C=O)), and groups in which two hydrogen atoms bonded to the same carbon atom have been substituted with a single sulfur atom (namely, groups containing a thiocarbonyl group (C=S)).

Examples of groups in which a portion of the carbon atoms of an alkyl group have been substituted with a hetero atom include examples in which a carbon atom has been substituted with a nitrogen atom (for example, straight-chain alkyl groups containing a —$CH_2$— group within the structure, wherein the —$CH_2$— has been substituted with a —NH— group), and examples in which a carbon atom has been substituted with an oxygen atom (for example, straight-chain alkyl groups containing a —$CH_2$— group within the structure, wherein the —$CH_2$— has been substituted with a —O— group).

In the present invention, in terms of achieving superior effects for the present invention, $R^1$ is most preferably an ethyl group.

$R^2$ represents a hydrogen atom or a lower alkyl group of 1 to 5 carbon atoms, and suitable examples of the lower alkyl group include straight-chain or branched alkyl groups such as a methyl group, ethyl group, propyl group, isopropyl group, n-butyl group, isobutyl group, tert-butyl group, pentyl group, isopentyl group and neopentyl group. In terms of industrial availability, $R^2$ is preferably a hydrogen atom or a methyl group, and a methyl group is particularly desirable.

Examples of the acid-dissociable, dissolution-inhibiting group (II) include a 1-ethoxyethyl group, 1-ethoxymethyl group, 1-methoxyethyl group, 1-methoxymethyl group, 1-methoxypropyl group, 1-ethoxypropyl group, 1-n-butoxyethyl group, 1-pentafluoroethoxyethyl group, 1-trifluoromethoxyethyl group, and 1-trifluoromethoxymethyl group.

In the present invention, within the compound (A1), a portion of the hydrogen atoms of the phenolic hydroxyl groups may also be substituted with another acid-dissociable, dissolution-inhibiting group (III) besides the acid-dissociable, dissolution-inhibiting group (II), provided such substitution does not impair the effects of the present invention. There are no particular restrictions on this other acid-dissociable, dissolution-inhibiting group (III), which may be selected appropriately from those groups proposed for use within the hydroxystyrene-based resins and (meth)acrylate-based resins and the like used in chemically amplified positive resist compositions designed for use with KrF or ArF excimer lasers. Here the term "(meth)acrylate" means either one of, or both, acrylate and methacrylate.

Specific examples include 1-branched or cyclic alkyloxyalkyl groups, tertiary alkyl groups, tertiary alkyloxycarbonyl groups, tertiary alkyloxycarbonylalkyl groups, and cyclic ether groups.

Examples of this 1-branched or cyclic alkyloxyalkyl group include groups that correspond with the case where $R^1$ within the above general formula (II) is a branched or cyclic alkyl group.

Specific examples of the branched alkyl group include an isopropyl group, isobutyl group, tert-butyl group, isopentyl group, neopentyl group, and tert-butyl group.

Specific examples of cyclic alkyl groups include a cyclopentyl group, cyclohexyl group, adamantyl group, norbornyl group, isobornyl group, tricyclodecanyl group, and tetracyclododecanyl group.

Specific examples of suitable tertiary alkyl groups include chain-like tertiary alkyl groups such as a tert-butyl group or tert-amyl group, and tertiary alkyl groups that contain an aliphatic polycyclic group, such as a 2-methyl-2-adamantyl group or 2-ethyl-2-adamantyl group. In this description and in the claims, the term "aliphatic" is a relative concept used in relation to the term "aromatic", and defines a group or compound or the like that contains no aromaticity. The term "aliphatic cyclic group" describes a monocyclic group or polycyclic group that contains no aromaticity, and may be either saturated or unsaturated, but is typically saturated.

Examples of the tertiary alkyl group within the above tertiary alkyloxycarbonyl groups and tertiary alkyloxycarbonylalkyl groups include the same groups as those described above.

Specific examples of suitable tertiary alkyloxycarbonyl groups include a tert-butyloxycarbonyl group and tert-amyloxycarbonyl group.

Specific examples of suitable tertiary alkyloxycarbonylalkyl groups include a tert-butyloxycarbonylmethyl group and tert-amyloxycarbonylmethyl group.

Specific examples of suitable cyclic ether groups include a tetrahydropyranyl group and tetrahydrofuranyl group.

The compound (A1) can be produced, for example, by using a known technique to substitute either a portion of, or all of, the hydrogen atoms of the phenolic hydroxyl groups of the polyhydric phenol compound (I) with acid-dissociable, dissolution-inhibiting groups (at least the acid-dissociable, dissolution-inhibiting group (II) from amongst the acid-dissociable, dissolution-inhibiting group (II) and the optional acid-dissociable, dissolution-inhibiting group (III)).

<<Positive Resist Composition>>

A positive resist composition of the present invention includes a base material component (A) that contains acid-dissociable, dissolution-inhibiting groups and exhibits increased alkali solubility under the action of acid (hereafter also referred to as the component (A)), and an acid generator component (B) that generates acid upon exposure (hereafter also referred to as the component (B)).

In the component (A), the action of the acid generated from the component (B) upon exposure causes the acid-dissociable, dissolution-inhibiting groups to dissociate, causing the entire component (A) to change from an alkali-insoluble state to an alkali-soluble state. As a result, when a resist film formed from the resist composition is selectively exposed during the formation of a resist pattern, or alternatively is exposed and then subjected to post exposure baking, the exposed portions of the resist shift to an alkali-soluble state, whereas the unexposed portions remain insoluble in alkali, meaning alkali developing can then be used to form a positive resist pattern.

In the positive resist composition of the present invention, the component (A) must contain an aforementioned compound (A1) of the present invention.

The compound (A1) may use either a single compound, or a combination of two or more different compounds.

In those cases where the compound (A1) contains two or more compounds, and for example contains a plurality of compounds for which the structure of the polyhydric phenol compound (I) is the same, but in which the number of phenolic hydroxyl groups in which the hydrogen atom has been substituted with an acid-dissociable, dissolution-inhibiting group (namely, at least the acid-dissociable, dissolution-inhibiting group (II) from amongst the acid-dissociable, dissolution-inhibiting group (II) and the optional acid-dissociable, dissolution-inhibiting group (III)) (hereafter, also referred to as simply the "phenolic hydroxyl groups that have been protected") is different for each compound (namely, the protection number is different), materials in which the protection numbers for the plurality of compounds are close in value produce superior effects for the present invention, and are consequently preferred.

The proportion of each of the plurality of different compounds within the compound (A1) can be measured using a technique such as reverse-phase chromatography.

Furthermore, the protection number within each of the plurality of different compounds can be adjusted by suitable alteration of the conditions employed when the phenolic hydroxyl groups of the polyhydric phenol compound (I) are protected with the acid-dissociable, dissolution-inhibiting groups.

The proportion of the compound (A1) within the component (A) is preferably greater than 40% by weight, even more preferably greater than 50% by weight, even more preferably greater than 80% by weight, and is most preferably 100% by weight.

The proportion of the compound (A1) within the component (A) can be measured using a technique such as reverse-phase chromatography.

The component (A) may also include an unprotected form in which none of the phenolic hydroxyl groups within the polyhydric phenol compound (I) are protected with acid-dissociable, dissolution-inhibiting groups, namely, the polyhydric phenol compound (I) itself.

In the component (A), the proportion of the polyhydric phenol compound (I) is preferably kept as low as possible, and is preferably no higher than 60% by weight, even more preferably no higher than 50% by weight, even more preferably 10% by weight or less, and is most preferably 0% by weight. Provided the quantity of the polyhydric phenol compound (I) is no higher than 60% by weight, the effects of the present invention can be further enhanced.

The proportion of the polyhydric phenol compound (I) within the component (A) can be adjusted, for example, by using gel permeation chromatography (GPC) to remove the polyhydric phenol compound (I).

The proportion of the polyhydric phenol compound (I) within the component (A) can be measured using a technique such as reverse-phase chromatography.

In the component (A), the protection ratio for the phenolic hydroxyl groups within the component (A), namely, the proportion of phenolic hydroxyl groups that have been protected with acid-dissociable, dissolution-inhibiting groups relative to the combined total of the phenolic hydroxyl groups that have been protected with acid-dissociable, dissolution-inhibiting groups and the unprotected phenolic hydroxyl groups, can be determined appropriately based on factors such as the structure of the polyhydric phenol compound (I), the number of phenolic hydroxyl groups, and the various lithography properties desired. For example, from the viewpoints of resolution and the roughness reduction effect, the protection ratio is preferably within a range from 5 to 50 mol %, even more preferably from 7 to 45 mol %, and is most preferably from 15 to 45 mol %.

The component (A) may also include any of the conventional resin components that have been proposed as base material components for chemically amplified resist layers, provided the inclusion of these components does not impair the effects of the present invention.

Examples of these resin components include any of the materials proposed as base resins for conventional chemically amplified positive resist compositions for use with a KrF excimer laser or positive resist compositions for use with an ArF excimer laser, and these can be selected in accordance with the nature of the exposure light source used during resist pattern formation.

The quantity of the component (A) within the positive resist composition of the present invention may be adjusted in accordance with the film thickness of the resist to be formed.

There are no particular restrictions on the component (B), which can use any of the acid generators proposed for use within conventional chemically amplified resists. Examples of these acid generators are numerous, and include onium salt-based acid generators such as iodonium salts and sulfonium salts, oxime sulfonate-based acid generators, diazomethane-based acid generators such as bisalkyl or bisaryl sulfonyl diazomethanes and poly(bis-sulfonyl)diazomethanes, nitrobenzyl sulfonate-based acid generators, iminosulfonate-based acid generators, and disulfone-based acid generators.

Examples of suitable onium salt-based acid generators include compounds represented by general formulas (b-1) and (b-2) shown below.

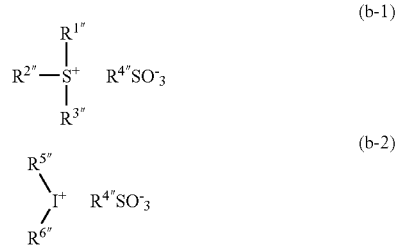

[wherein, $R^{1''}$ to $R^{3''}$, and $R^{5''}$ to $R^{6''}$ each represent, independently, an aryl group or alkyl group; and $R^{4''}$ represents a straight-chain, branched or cyclic alkyl group or fluoroalkyl group; provided that at least one of $R^{1''}$ to $R^{3''}$ represents an aryl group, and at least one of $R^{5''}$ to $R^{6''}$ represents an aryl group]

In the formula (b-1), $R^{1''}$ to $R^{3''}$ each represent, independently, an aryl group or alkyl group. Of the groups $R^{1''}$ to $R^{3''}$, at least one group represents an aryl group. Compounds in which at least two of $R^{1''}$ to $R^{3''}$ represent aryl groups are preferred, and compounds in which all of $R^{1''}$ to $R^{3''}$ are aryl groups are the most preferred.

There are no particular restrictions on the aryl groups of $R^{1''}$ to $R^{3''}$, and suitable examples include aryl groups of 6 to 20 carbon atoms, in which either a portion of, or all of, the hydrogen atoms of these aryl groups may be either substituted, or not substituted, with alkyl groups, alkoxy groups, or halogen atoms and the like. In terms of enabling low-cost synthesis, aryl groups of 6 to 10 carbon atoms are preferred. Specific examples of suitable groups include a phenyl group and a naphthyl group.

Alkyl groups that may be used for substitution of the hydrogen atoms of the above aryl groups are preferably alkyl groups of 1 to 5 carbon atoms, and a methyl group, ethyl group, propyl group, n-butyl group or tert-butyl group are the most desirable.

Alkoxy groups that may be used for substitution of the hydrogen atoms of the above aryl groups are preferably alkoxy groups of 1 to 5 carbon atoms, and a methoxy group or ethoxy group are the most desirable.

Halogen atoms that may be used for substitution of the hydrogen atoms of the above aryl groups are preferably fluorine atoms.

There are no particular restrictions on the alkyl groups of $R^{1''}$ to $R^{3''}$, and suitable examples include straight-chain, branched, or cyclic alkyl groups of 1 to 10 carbon atoms. From the viewpoint of achieving excellent resolution, alkyl groups of 1 to 5 carbon atoms are preferred. Specific examples include a methyl group, ethyl group, n-propyl group, isopropyl group, n-butyl group, isobutyl group, n-pentyl group, cyclopentyl group, hexyl group, cyclohexyl group, nonyl group, and decanyl group, although in terms of achieving superior resolution and enabling low-cost synthesis, a methyl group is the most desirable.

Of the above possibilities, compounds in which $R^{1''}$ to $R^{3''}$ are all phenyl groups are the most preferred.

The group $R^{4''}$ represents a straight-chain, branched or cyclic alkyl group or fluoroalkyl group.

As the straight-chain or branched alkyl group, groups of 1 to 10 carbon atoms are preferred, groups of 1 to 8 carbon atoms are even more preferred, and groups of 1 to 4 carbon atoms are the most desirable.

Suitable cyclic alkyl groups include the same groups as those listed above in relation to the group $R^{1''}$, and cyclic groups of 4 to 15 carbon atoms are preferred, groups of 4 to 10 carbon atoms are even more preferred, and groups of 6 to 10 carbon atoms are the most desirable.

As the above fluoroalkyl group, groups of 1 to 10 carbon atoms are preferred, groups of 1 to 8 carbon atoms are even more preferred, and groups of 1 to 4 carbon atoms are the most desirable. Furthermore, the fluorination ratio of the fluoroalkyl group (namely, the fluorine atom proportion within the alkyl group) is preferably within a range from 10 to 100%, and even more preferably from 50 to 100%, and groups in which all of the hydrogen atoms have been substituted with fluorine atoms yield the strongest acids, and are consequently the most desirable.

The group $R^{4''}$ is most preferably a straight-chain or cyclic alkyl group, or a fluoroalkyl group.

In the formula (b-2), $R^{5''}$ to $R^{6''}$ each represent, independently, an aryl group or alkyl group. At least one of $R^{5''}$ to $R^{6''}$ represents an aryl group. Compounds in which all of $R^{5''}$ to $R^{6''}$ are aryl groups are preferred.

Suitable examples of the aryl groups of the groups $R^{5''}$ to $R^{6''}$ include the same aryl groups as those described above for the groups $R^{1''}$ to $R^{3''}$.

Suitable examples of the alkyl groups of the groups $R^{5''}$ to $R^{6''}$ include the same alkyl groups as those described above for the groups $R^{1''}$ to $R^{3''}$.

Of the above possibilities, compounds in which $R^{5''}$ to $R^{6''}$ are all phenyl groups are the most preferred.

Suitable examples of the group $R^{4''}$ in the formula (b-2) include the same groups as those described for the group $R^{4''}$ in the aforementioned formula (b-1).

Specific examples of suitable onium salt-based acid generators include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, 38diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, tri(4-tert-butyl)phenylsulfonium trifluoromethanesulfonate, heptafluoropropanesulfonate or nonafluorobutanesulfonate, and diphenyl(1-(4-methoxy)naphthyl)sulfonium trifluoromethanesulfonate, heptafluoropropanesulfonate or nonafluorobutanesulfonate. Furthermore, onium salts in which the anion portion of the above onium salts have been substituted with methanesulfonate, n-propanesulfonate, n-butanesulfonate, or n-octanesulfonate can also be used.

Furthermore, compounds in which the anion portion within the above general formulas (b-1) and (b-2) has been substituted with an anion portion represented by a general formula (b-3) or (b-4) shown below (and in which the cation portion is the same as that shown in (b-1) or (b-2)) can also be used.

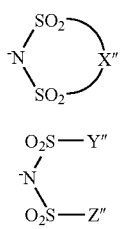

[wherein, X" represents an alkylene group of 2 to 6 carbon atoms in which at least one hydrogen atom has been substituted with a fluorine atom; Y" and Z" each represent, independently, an alkyl group of 1 to 10 carbon atoms in which at least one hydrogen atom has been substituted with a fluorine atom]

The group X" is a straight-chain or branched alkylene group in which at least one hydrogen atom has been substituted with a fluorine atom, and the number of carbon atoms within the alkylene group is typically within a range from 2 to 6, preferably from 3 to 5, and is most preferably 3.

Y" and Z" each represent, independently, a straight-chain or branched alkyl group in which at least one hydrogen atom has been substituted with a fluorine atom, and the number of carbon atoms within the alkyl group is typically within a range from 1 to 10, preferably from 1 to 7, and is most preferably from 1 to 3.

Within the above ranges for the numbers of carbon atoms, lower numbers of carbon atoms within the alkylene group X" or the alkyl groups Y" and Z" result in better solubility within the resist solvent, and are consequently preferred.

Furthermore, in the alkylene group X" or the alkyl groups Y" and Z", the larger the number of hydrogen atoms that have been substituted with fluorine atoms, the stronger the acid becomes, and the transparency relative to high energy light beams of 200 nm or less or electron beams also improves favorably. The fluorine atom proportion within the alkylene group or alkyl groups, namely the fluorination ratio, is preferably within a range from 70 to 100%, and even more preferably from 90 to 100%, and perfluoroalkylene or perfluoroalkyl groups in which all of the hydrogen atoms have been substituted with fluorine atoms are the most desirable.

In the present invention, the term "oxime sulfonate-based acid generator" describes a compound that contains at least one group represented by a general formula (B-1) shown below, and generates acid upon irradiation. These types of oxime sulfonate-based acid generators are widely used within chemically amplified resist compositions, and any of these conventional compounds can be used.

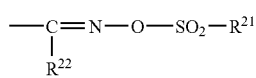

[In the formula (B-1), $R^{21}$ and $R^{22}$ each represent, independently, an organic group.]

In the present invention, the above organic groups preferably include carbon atoms, and may also include atoms other than carbon atoms (such as hydrogen atoms, oxygen atoms, nitrogen atoms, sulfur atoms, and halogen atoms (such as fluorine atoms or chlorine atoms)).

The organic group of $R^{21}$ is preferably a straight-chain, branched or cyclic alkyl group or aryl group. These alkyl groups or aryl groups may also include a substituent group. There are no particular restrictions on such substituent groups, and suitable examples include a fluorine atom or a straight-chain, branched or cyclic alkyl group of 1 to 6 carbon atoms. Here, the expression "include a substituent group" means that either a portion of, or all of, the hydrogen atoms of the alkyl group or aryl group may be substituted with substituent groups.

The alkyl group preferably contains from 1 to 20 carbon atoms, even more preferably from 1 to 10 carbon atoms, even more preferably from 1 to 8 carbon atoms, even more preferably from 1 to 6 carbon atoms, and most preferably from 1 to 4 carbon atoms. Furthermore, alkyl groups that are partially or completely halogenated (hereafter also referred to as haloalkyl groups) are preferred. A partially halogenated alkyl group is an alkyl group in which a portion of the hydrogen atoms have been substituted with halogen atoms, whereas a completely halogenated alkyl group is an alkyl group in which all of the hydrogen atoms have been substituted with halogen atoms. Examples of the halogen atoms include fluorine atoms, chlorine atoms, bromine atoms or iodine atoms, although fluorine atoms are particularly desirable. In other words, the haloalkyl group is preferably a fluoroalkyl group.

The aryl group preferably contains from 4 to 20 carbon atoms, even more preferably from 4 to 10 carbon atoms, and most preferably from 6 to 10 carbon atoms. Aryl groups that are partially or completely halogenated are preferred. A partially halogenated aryl group is an aryl group in which a portion of the hydrogen atoms have been substituted with halogen atoms, whereas a completely halogenated aryl group is an aryl group in which all of the hydrogen atoms have been substituted with halogen atoms.

As the group $R^{21}$, an alkyl group of 1 to 4 carbon atoms containing no substituent groups, or a fluoroalkyl group of 1 to 4 carbon atoms is the most desirable.

The organic group of $R^{22}$ is preferably a straight-chain, branched or cyclic alkyl group, an aryl group, or a cyano group. Examples of suitable alkyl groups and aryl groups for $R^{22}$ include the same alkyl groups and aryl groups described above in relation to $R^{21}$.

As the group $R^{22}$, a cyano group, an alkyl group of 1 to 8 carbon atoms containing t no substituent groups, or a fluoroalkyl group of 1 to 8 carbon atoms is the most desirable.

Particularly preferred oxime sulfonate-based acid generators include the compounds represented by the general formulas (B-2) and (B-3) shown below.

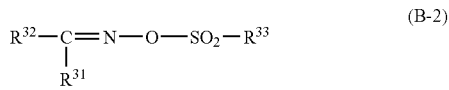

[In the formula (B-2), $R^{31}$ represents a cyano group, an alkyl group containing no substituent groups, or a haloalkyl group. $R^{32}$ represents an aryl group. $R^{33}$ represents an alkyl group containing no substituent groups, or a haloalkyl group.]

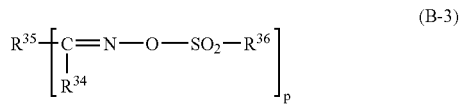

[In the formula (B-3), $R^{34}$ represents a cyano group, an alkyl group containing no substituent groups, or a haloalkyl group. $R^{35}$ represents a bivalent or trivalent aromatic hydrocarbon group. $R^{36}$ represents an alkyl group containing no substituent groups, or a haloalkyl group. p is either 2 or 3.]

In the above general formula (B-2), the alkyl group containing no substituent groups or haloalkyl group represented by $R^{31}$ preferably contains from 1 to 10 carbon atoms, even more preferably from 1 to 8 carbon atoms, and most preferably from 1 to 6 carbon atoms.

The group $R^{31}$ is preferably a haloalkyl group, and even more preferably a fluoroalkyl group.

In the fluoroalkyl group of $R^{31}$, at least 50% of the hydrogen atoms of the alkyl group are preferably fluorinated, and this ratio is even more preferably 70% or higher, and is most preferably 90% or higher.

The aryl group represented by $R^{32}$ is preferably a group in which one hydrogen atom has been removed from an aromatic hydrocarbon ring, such as a phenyl group, biphenyl group, fluorenyl group, naphthyl group, anthracyl (anthryl) group or phenanthryl group, or a heteroaryl group in which a portion of the carbon atoms that constitute the ring structure within the above groups have been substituted with a hetero atom such as an oxygen atom, sulfur atom or nitrogen atom. Of these possibilities, a fluorenyl group is particularly preferred.

The aryl group of $R^{32}$ may include a substituent group such as an alkyl group, haloalkyl group or alkoxy group of 1 to 10 carbon atoms. The alkyl group or haloalkyl group substituent groups preferably contain from 1 to 8 carbon atoms, and even more preferably 1 to 4 carbon atoms. Furthermore, the haloalkyl group is preferably a fluoroalkyl group.

The alkyl group containing no substituent groups or haloalkyl group represented by $R^{33}$ preferably contains from 1 to 10 carbon atoms, even more preferably from 1 to 8 carbon atoms, and most preferably from 1 to 6 carbon atoms.

The group $R^{33}$ is preferably a haloalkyl group, and even more preferably a partially or totally fluorinated alkyl group.

In the fluoroalkyl group of $R^{33}$, at least 50% of the hydrogen atoms of the alkyl group are preferably fluorinated, and groups in which 70% or more, and even more preferably 90% or more, of the hydrogen atoms are fluorinated are particularly desirable as they increase the strength of the acid that is generated. Completely fluorinated alkyl groups in which 100% of the hydrogen atom have been substituted with fluorine atoms are the most desirable.

In the above general formula (B-3), examples of the alkyl group containing no substituent groups or haloalkyl group represented by $R^{34}$ include the same alkyl groups containing no substituent groups and haloalkyl groups described above for the group $R^{31}$.

Examples of the bivalent or trivalent aromatic hydrocarbon group represented by $R^{35}$ include groups in which a further one or two hydrogen atoms respectively are removed from an aryl group of the aforementioned group $R^{32}$.

Examples of the alkyl group containing no substituent groups or haloalkyl group represented by $R^{36}$ include the same alkyl groups containing no substituent groups and haloalkyl groups described above for the group $R^{33}$.

p is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)-benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further examples include the compounds represented by the chemical formulas shown below.

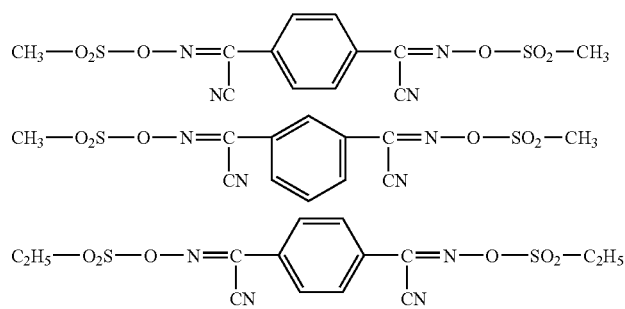

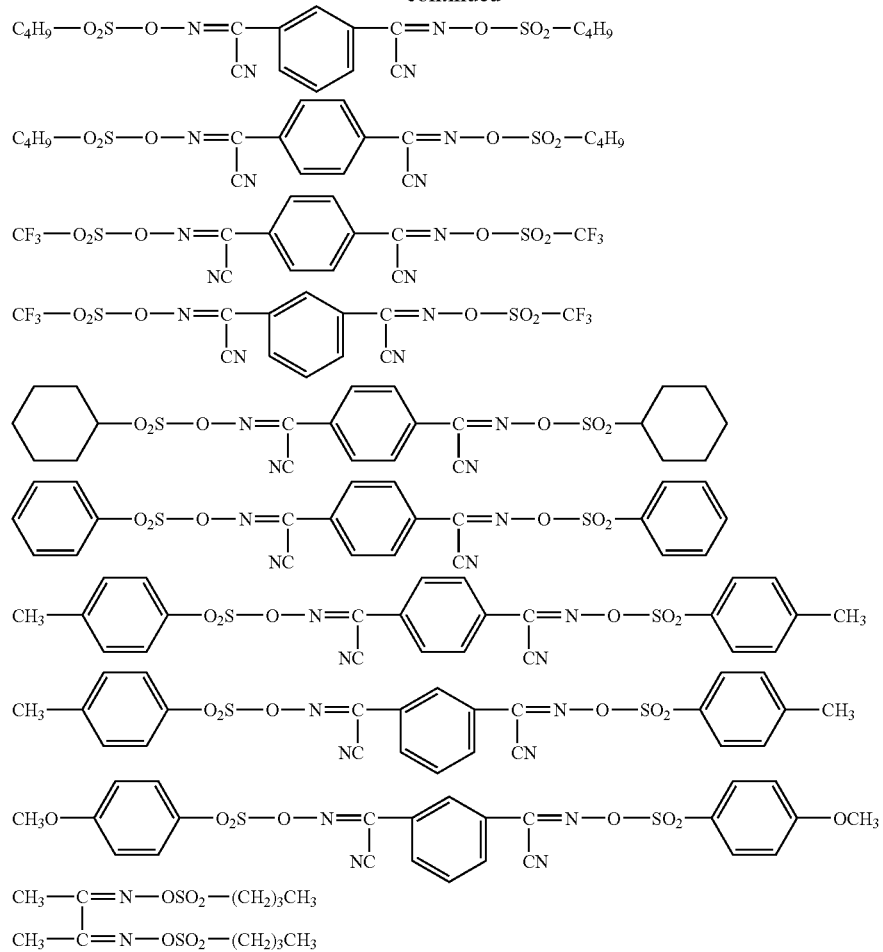
Furthermore, of the compounds represented by the aforementioned general formulas (B-2) and (B-3), examples of particularly preferred compounds include those shown below.
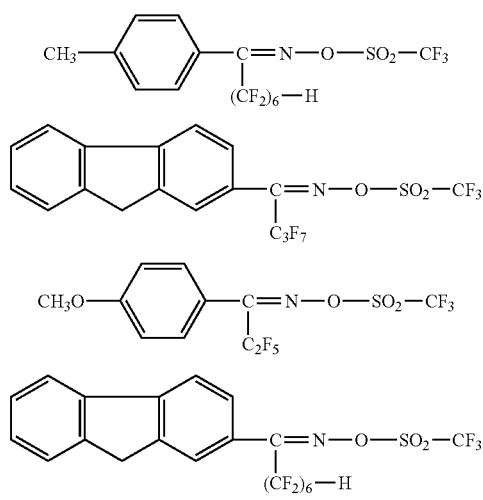
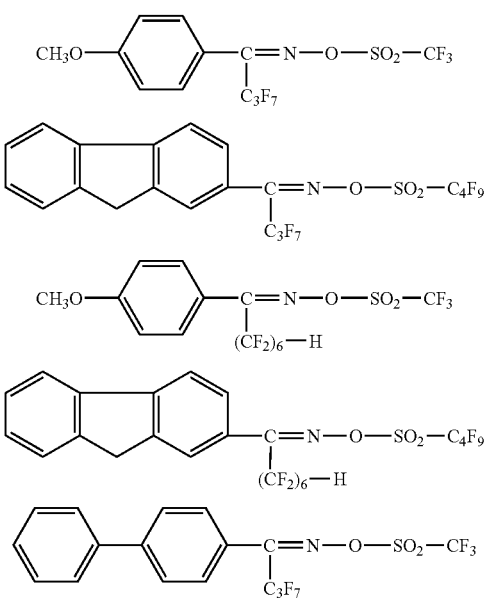

-continued
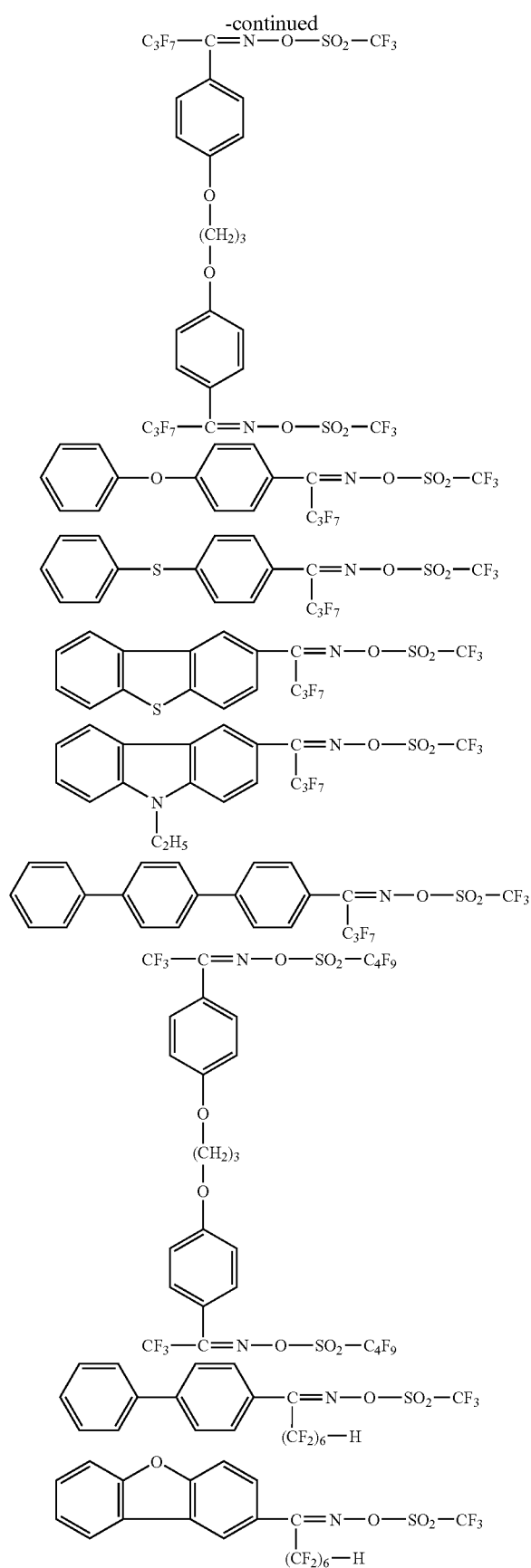
-continued
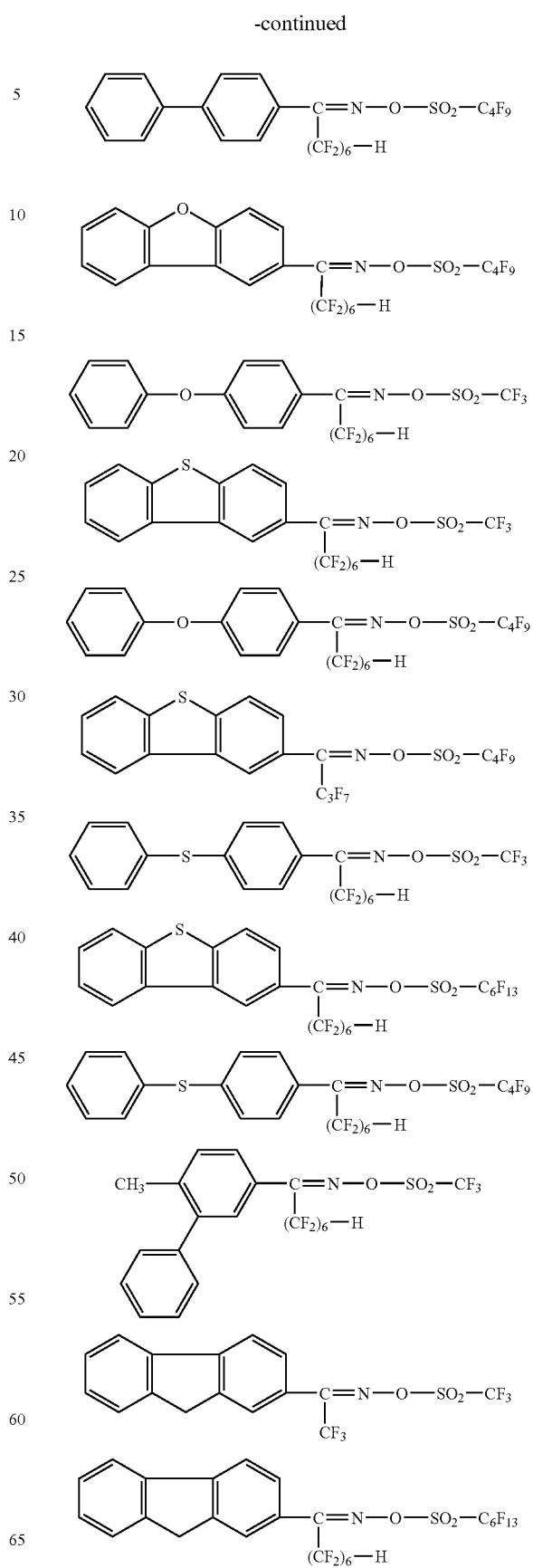

Of the above compounds, the three compounds shown below are particularly desirable.

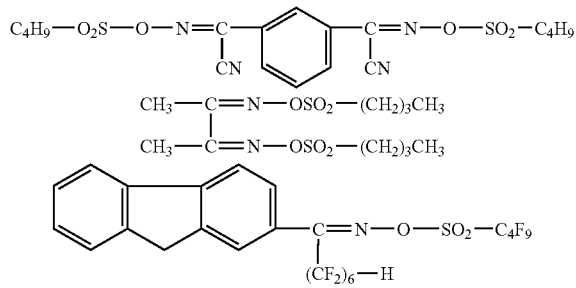

Of the various diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Furthermore, specific examples of poly(bis-sulfonyl)diazomethanes include the structures shown below, such as 1,3-bis(phenylsulfonyldiazomethylsulfonyl)propane (wherein A=3), 1,4-bis(phenylsulfonyldiazomethylsulfonyl)butane (wherein A=4), 1,6-bis(phenylsulfonyldiazomethylsulfonyl)hexane (wherein A=6), 1,10-bis(phenylsulfonyldiazomethylsulfonyl)decane (wherein A=10), 1,2-bis(cyclohexylsulfonyldiazomethylsulfonyl)ethane (wherein B=2), 1,3-bis(cyclohexylsulfonyldiazomethylsulfonyl)propane (wherein B=3), 1,6-bis(cyclohexylsulfonyldiazomethylsulfonyl)hexane (wherein B=6), and 1,10-bis(cyclohexylsulfonyldiazomethylsulfonyl)decane (wherein B=10).

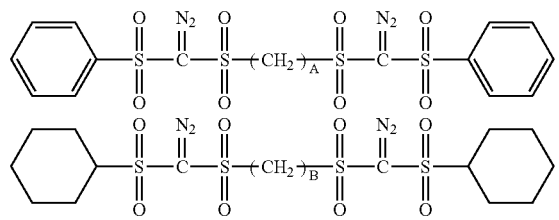

In the present invention, of the various possibilities, the component (B) is preferably an onium salt containing a fluorinated alkylsulfonate ion or alkylsulfonate ion as the anion.

As the component (B), either a single acid generator may be used alone, or a combination of two or more of these acid generators may be used.

The blend quantity of the component (B) is typically within a range from 0.5 to 30 parts by weight, and preferably from 1 to 10 parts by weight, per 100 parts by weight of the component (A). Ensuring the quantity satisfies this range enables satisfactory pattern formation to be achieved. Furthermore, a uniform solution can be obtained, and the storage stability is also favorable.

[Optional Components]

In the positive resist composition, in order to improve the resist pattern shape and the post exposure stability of the latent image formed by the pattern-wise exposure of the resist layer, a nitrogen-containing organic compound (D) (hereafter referred to as the component (D)) may be added as an optional component.

A multitude of these nitrogen-containing organic compounds have already been proposed, and any of these known compounds can be used, and suitable examples include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine. Of these compounds, secondary aliphatic amines and tertiary aliphatic amines are preferred, trialkylamines of 5 to 10 carbon atoms are even more preferred, and tri-n-octylamine is the most desirable.

These compounds may be used either alone, or in combinations of two or more different compounds.

The component (D) is typically used in a quantity within a range from 0.01 to 5.0 parts by weight per 100 parts by weight of the component (A).

Furthermore, in order to prevent any deterioration in sensitivity caused by the addition of the above component (D), and improve the resist pattern shape and the post exposure stability of the latent image formed by the pattern-wise exposure of the resist layer, an organic carboxylic acid, or a phosphorus oxo acid or derivative thereof (E) (hereafter referred to as the component (E)) may also be added to the positive resist composition of the present invention as another optional component. The component (D) and the component (E) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

Other miscible additives can also be added to the positive resist composition of the present invention according to need, and examples include additive resins for improving the performance of the resist film, surfactants for improving the coating properties, dissolution inhibitors, plasticizers, stabilizers, colorants, halation prevention agents, and dyes and the like.

The positive resist composition of the present invention can be produced by dissolving the aforementioned component (A) and component (B), together with any of the various optional components, in an organic solvent.

The organic solvent may be any solvent capable of dissolving the various components used to generate a uniform solution, and one or more solvents selected from known materials used as the solvents for conventional chemically amplified resists can be used.

Examples of the solvent include lactones such as γ-butyrolactone, ketones such as acetone, methyl ethyl ketone, cyclohexanone, methyl isoamyl ketone and 2-heptanone, polyhydric alcohols and derivatives thereof such as ethylene glycol, ethylene glycol monoacetate, diethylene glycol, diethylene glycol monoacetate, propylene glycol, propylene glycol monoacetate, dipropylene glycol, the monomethyl ether, monoethyl ether, monopropyl ether, monobutyl ether or monophenyl ether of dipropylene glycol monoacetate, and propylene glycol monomethyl ether acetate (PGMEA), cyclic ethers such as dioxane, and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These organic solvents may be used either alone, or as a mixed solvent containing two or more different solvents.

Furthermore, mixed solvents produced by mixing propylene glycol monomethyl ether acetate (PGMEA) with a polar solvent are preferred. Although the blend ratio (weight ratio) in such mixed solvents can be set in accordance with factors such as the co-solubility of the PGMEA and the polar solvent, the ratio is preferably within a range from 1:9 to 9:1, and is even more preferably from 2:8 to 8:2.

More specifically, in those cases where EL is added as the polar solvent, the weight ratio PGMEA:EL is preferably within a range from 1:9 to 9:1, and is even more preferably from 2:8 to 8:2.

Furthermore, as the organic solvent, mixed solvents containing at least one of PGMEA and EL, together with γ-butyrolactone, are also preferred. In such cases, the weight ratio of the former and latter components in the mixed solvent is preferably within a range from 70:30 to 95:5.

There are no particular restrictions on the quantity used of the organic solvent, although the quantity should be set in accordance with the coating film thickness required, at a concentration that enables favorable application of the solution to a substrate or the like, and typically the quantity of solvent is set so that the solid fraction concentration of the resist composition falls within a range from 2 to 20% by weight, and preferably from 5 to 15% by weight.

<<Method for Resist Pattern Formation>>

A method for resist pattern formation according to the present invention includes the steps of: forming a resist film on a substrate using the positive resist composition according to the present invention described above, conducting exposure of the resist film, and developing the resist film to form a resist pattern.

More specifically, a resist pattern can be formed, for example, using the method for resist pattern formation described below. Namely, the positive resist composition described above is first applied to a substrate such as a silicon wafer using a spinner or the like, and an optional prebake (PAB) is then conducted, thereby forming a resist film. Following selective exposure of the thus formed resist film, either by exposure through a mask pattern using an exposure apparatus such as an electron beam lithography apparatus or an EUV exposure apparatus, or by patterning via direct irradiation with an electron beam without using a mask pattern, PEB (post exposure baking) is conducted.

Subsequently, developing is conducted using an alkali developing solution, a rinse treatment is performed to wash away the residual developing solution on the substrate and the portions of the resist composition that have been dissolved by the developing solution, and the resist is then dried, yielding a resist pattern.

These steps can be conducted using conventional techniques. The conditions during the operation are preferably set in accordance with factors such as the formulation and properties of the positive resist composition.

There are no particular restrictions on the exposure source, and an ArF excimer laser, KrF excimer laser, $F_2$ excimer laser, or other radiation such as EUV (extreme ultra violet), VUV (vacuum ultra violet), electron beam, X-ray or soft X-ray radiation can be used. The positive resist composition according to the present invention is particularly effective for use with an electron beam or EUV radiation, and an electron beam is particularly desirable.

In some cases, the method may include a post bake step following the above alkali developing step, and an organic or inorganic anti-reflective film may also be provided between the substrate and the resist film.

As described above, according to the compound (A1) of the present invention, a positive resist composition containing the compound (A1), and a method for resist pattern formation that uses the positive resist composition, a high resolution resist pattern with a reduced level of roughness can be formed.

Moreover, in addition to the above effects, the present invention also yields an improvement in sensitivity.

It is thought that the reason for the reduction in roughness is that because the compound (A1) has a structure in which the basic skeleton is based on the polyhydric phenol compound (I), and the phenolic hydroxyl groups of this phenol compound are protected with the acid-dissociable, dissolution-inhibiting group (II), a resist film obtained using a positive resist composition that contains this compound (A1) will exhibit a more uniform dissolution behavior relative to the developing solution.

In other words, with conventional resists that use a polymer (with a large molecular size of approximately several nm) as the base material component, during the spin coating process used for forming the resist film, those molecules with a higher level of hydrophilicity and those molecules with a higher level of hydrophobicity tend to accumulate in a partially localized manner, meaning fluctuations tend to develop in the distribution within the resist film of the various components such as the component (B) and the like. Furthermore, variations also develop in the degree of dissociation of the acid-dissociable, dissolution-inhibiting groups within the polymer compound. It is thought that, as a result, roughness has tended to increase as a result of factors such as a lack of uniformity in the rate at which the acid-dissociable, dissolution-inhibiting groups undergo dissociation under the action of the generated acid at the interface between the exposed portions and the unexposed portions (namely, the deprotection reaction), fluctuations in the alkali solubility of the various base material component molecules following the deprotection reaction, and fluctuations in the solubility rate of the resist film.

In contrast, in the present invention, it is thought that because the compound (A1) has the structure described above, the properties (such as the hydrophilicity, hydrophobicity and crystallinity) of a resist film obtained using a positive resist composition that contains the compound (A1) are more uniform, and moreover, it is also thought that because the acid-dissociable, dissolution-inhibiting group (II) dissociates very readily, the dissociation of the acid-dissociable, dissolution-inhibiting groups at the time of exposure also occurs in a more uniform manner. In other words, it is surmised that because a more uniform film can be formed, and the acid-dissociable, dissolution-inhibiting groups also dissociate in a uniform manner, the dissolution behavior relative to the developing solution becomes more uniform, enabling the level of roughness to be reduced.

EXAMPLES

As follows is a description of examples of the present invention, although the scope of the present invention is in no way limited by these examples.

Synthesis Example 1

Synthesis of Precursor Compound

The precursor compound shown below was synthesized using the procedure described below.

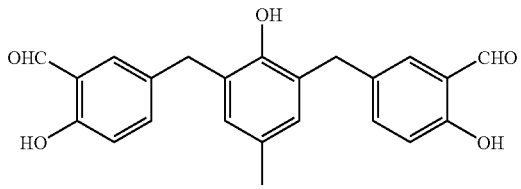

IUPAC Name:

5-({3-[(3-formyl-4-hydroxyphenyl)methyl]-2-hydroxy-5-methylphenyl}methyl)-2-hydroxybenzaldehyde Under an atmosphere of nitrogen, 244.0 g (2.0 mol) of salicylaldehyde was weighed into a four-neck flask with a capacity of 1 liter fitted with a reflux condenser, a thermometer and a stirrer, and 244.0 g of a 75% aqueous solution of phosphoric acid was then added dropwise to the flask over a period of 30 minutes and stirred at room temperature. 84.0 g (0.5 mol) of a powdered form of 2,6-bis(hydroxymethyl)-4-methylphenol was then added to the mixed solution intermittently at 60° C. over a 6 hour period, and the resulting mixture was then stirred for a further 17 hours. 366.0 g of methyl isobutyl ketone was then added to the reaction mixture, a phase separation was performed, and the 235.0 g water layer (phase) was removed. The reaction system was then neutralized by adding 80.6 g of a 16% aqueous solution of sodium hydroxide, 150 g of water was added, water washing was conducted at 80° C., and the water phase was then separated and removed. This water washing and separation operation was repeated a further two times, the resulting residue was concentrated under reduced pressure at 160° C., and following the addition of 94.0 g of methyl isobutyl ketone to the residue at 120° C., 470.0 g of toluene was added at 110° C. to crystallize the product. The resulting crystals were isolated by filtration, yielding 160.6 g of a wet cake. This wet cake was transferred to a four-neck flask with a capacity of 1 liter, and dissolved by adding 240.0 g of methyl isobutyl ketone. Subsequently, the solution was concentrated at normal pressure by heating to 130° C., 184.0 g of toluene was added, and a further concentration was conducted at normal pressure by heating to 115° C. 240.0 g of toluene was then added to the residue to crystallize the product. The crystals were collected by filtration, yielding 89.7 g (yield: 47.7%) of the target product (the precursor compound). (Identification by LC-MS (liquid chromatography-mass spectrometry) (using APCI (Atmospheric Pressure Chemical Ionization)) revealed a Mw value of 375).

The results of proton nuclear magnetic resonance ($^1$H-NMR) spectral analysis (400 MHz, solvent: DMSO-$d_6$ (deuterated dimethylsulfoxide)) of the precursor compound are shown in Table 1.

TABLE 1

| ppm | Assignment | Signal type | Number of protons |
|---|---|---|---|
| 10.54 | —CHO | s | 2 |
| 10.23 | Ph-OH | s | 2 |
| 8.31 | Ph-OH | s | 1 |
| 7.48 to 6.73 | Ph-H | m | 8 |
| 3.86 | —CH$_2$ | s | 4 |
| 2.11 | —CH$_3$ | s | 3 |

Synthesis Example 2

Synthesis of Compound (1)

The compound (1) shown below was synthesized using the procedure described below.

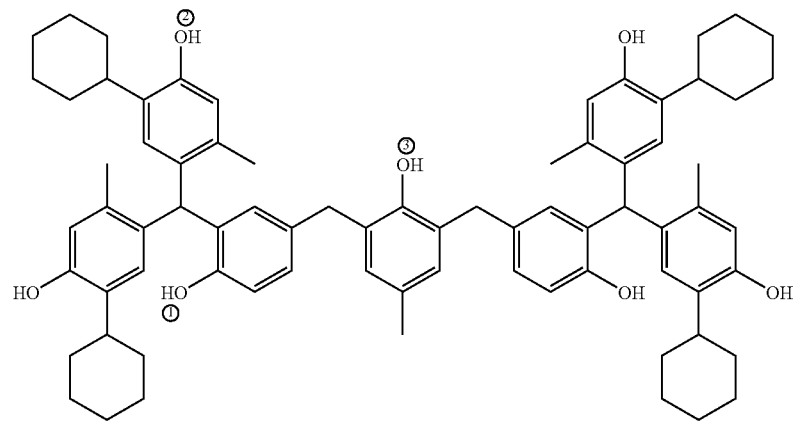

IUPAC Name:

4-[(5-{[3-({3-[bis(5-cyclohexyl-4-hydroxy-2-methylphenyl)methyl]-4-hydroxyphenyl}methyl)-2-hydroxy-5-methylphenyl]methyl}-2-hydroxyphenyl)(5-cyclohexyl-4-hydroxy-2-methylphenyl)methyl]-2-cyclohexyl-5-methylphenol A four-neck flask was charged with 376.2 g (1.98 mol) of 3-methyl-6-cyclohexylphenol and 92.8 g of methanol, 58.4 g of hydrogen chloride gas was blown into the system at a temperature of 30° C., a further 338.4 g of methanol was added, and 169.2 g (0.45 mol) of the precursor compound obtained in the synthesis example 1 was then added to the reaction system at 40° C. over a period of one hour and 30 minutes to effect a reaction. Subsequently, the reaction was continued by stirring for two hours at 40° C. (crystal precipitation began to occur after stirring for approximately 1 hour).

Subsequently, the reaction system was neutralized using 400.1 g of a 16% by weight aqueous solution of sodium hydroxide, the temperature was then raised to 60° C., 500 g of toluene and 500 g of cyclohexane were added, the temperature was cooled to 25° C., and the crude crystals were collected by filtration. These crude crystals, 975 g of propyl acetate and 400 g of water were combined in a four-neck flask, and following dissolution by heating to 70° C., the system was allowed to stand for 10 minutes, the water layer was removed, a further 60 g of water was added, and the same operation of washing with water followed by separation of the water layer was conducted. Subsequently, a concentration was conducted at atmospheric pressure to remove 777 g by distillation, and 800 g of toluene was added. The resulting mixture was cooled to 25° C., and the precipitate was filtered off and dried, yielding 373.9 g of a light yellow powder of the target product.

Purity: 97.9% (determined by HPLC: high performance liquid chromatography), melting point: 271.8° C. (determined by DSC: differential scanning calorimeter, and measured at peak top), yield: 75.5% (relative to the 5-({3-[(3-formyl-4-hydroxyphenyl)methyl]-2-hydroxy-5-methylphenyl}methyl)-2-hydroxybenzaldehyde) (Identification)

Analysis by LC-MS (APCI) confirmed the molecular weight was that of the target product.

The results of $^1$H-NMR spectral analysis (400 MHz, solvent: DMSO-$d_6$) of the compound (I) are shown in Table 2.

TABLE 2

| Shift value (ppm) | Number of protons | Signal type | Assignment |
| --- | --- | --- | --- |
| 1.05 to 1.65 | 40 | m | —$CH_2$ (cyclohexyl) |
| 2.04 to 2.08 | 15 | m | —$CH_3$ |
| 2.68 to 2.71 | 4 | t | —CH (cyclohexyl) |
| 3.67 | 4 | s | —$CH_2$ |
| 5.76 | 2 | s | —CH |
| 6.49 to 6.85 | 16 | m | Ph-H |
| 7.85 | 1 | s | —OH (Ph-OH): (3) |
| 8.78 | 4 | s | —OH (Ph-OH): (1) |
| 8.99 | 2 | s | —OH (Ph-OH): (2) |

Synthesis Example 3

Synthesis of Compound (2)

10 g of the compound (1) was dissolved in 50 g of tetrahydrofuran (THF), 1.5 g of ethyl vinyl ether was added, and the mixture was stirred at room temperature (r.t.) for 10 hours. Following completion of the reaction, the product was extracted and purified using water/ethyl acetate, and the separated ethyl acetate solution was dried over sodium sulfate and then concentrated under reduced pressure, yielding 9.5 g of a compound (2).

The protection ratio for the compound (2) (the proportion of the phenolic hydroxyl group hydrogen atoms within the compound (1) that have been substituted with 1-ethoxyethyl groups (as calculated by $^1$H-NMR)) was 20.1 mol %.

$^1$H-NMR (deuterated DMSO (deuterated dimethylsulfoxide), internal standard: tetramethylsilane) δ=8.70 to 9.10 (m, 4.65H), 7.77 to 7.91 (m, 0.94H), 6.36 to 7.00 (m, 16H), 5.69 to 5.83 (m, 2H), 5.15 to 5.40 (m, 1.41H), 3.34 to 3.75 (m, 6.81H), 2.58 to 2.85 (m, 4H), 1.90 to 2.19 (m, 15H), 0.88 to 1.85 (m, 48.4H)

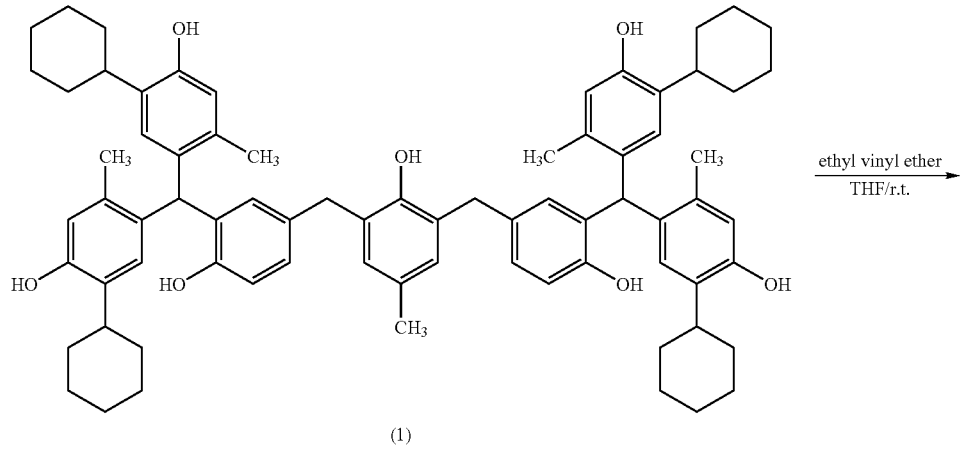

(1)

-continued

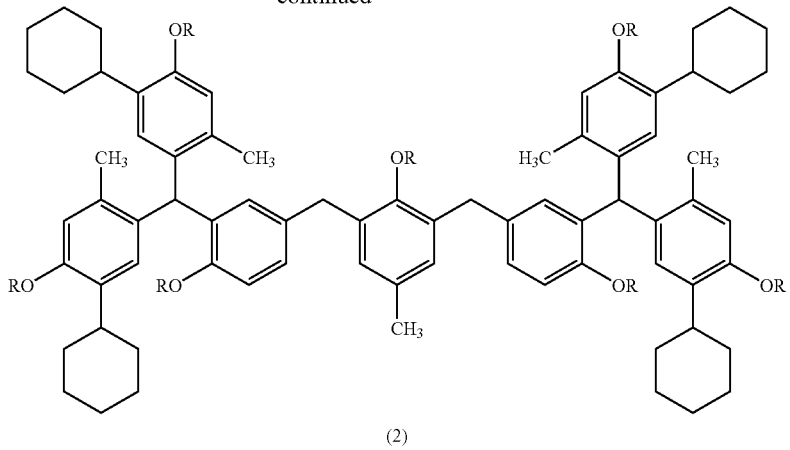

(2)

[In the formula (2), R represents a hydrogen atom or a 1-ethoxyethyl group.]

Example 1 and Comparative Example 1

The components shown in Table 3 were mixed together and dissolved, yielding positive resist composition solutions.

TABLE 3

|  | Component (A) | Component (B) | Component (D) | Organic solvent |
|---|---|---|---|---|
| Example 1 | Compound (2) [100] | PAG 1 [10] | Amine 1 [1.0] | Solvent 1 [1560] |
| Comparative example 1 | Resin (3) [100] | PAG 1 [10] | Amine 1 [1.0] | Solvent 1 [1560] |

In Table 3, the numerical values within the brackets [ ] represent blend quantities (parts by weight).

Resin (3): a resin in which 37.4 mol % of the hydroxyl groups within a polyhydroxystyrene (weight average molecular weight (Mw)=8,000, Mw/Mn=2.65) have been substituted with 1-ethoxyethyl groups.

PAG 1: triphenylsulfonium nonafluorobutanesulfonate.

Amine 1: tri-n-octylamine.

Solvent 1: a mixed solvent in which PGMEA/EL=6/4 (weight ratio).

Subsequently, using the prepared positive resist composition solutions, the evaluations described below were conducted. The results of the evaluations are shown in Table 4.

<Sensitivity>

Each positive resist composition solution was applied uniformly, using a spinner, to the surface of an 8-inch silicon substrate that had been treated with hexamethyldisilazane, and was then subjected to a bake treatment (PAB) at 110° C. for 90 seconds, thus forming a resist film (film thickness: 150 nm).

This resist film was then subjected to direct patterning (exposure) with an electron beam lithography apparatus HL-800D (VSB) (manufactured by Hitachi, Ltd.) at an accelerating voltage of 70 kV, and was subsequently subjected to a bake treatment (PEB) at 110° C. for 90 seconds, developed for 60 seconds in a 2.38% by weight aqueous solution (at 23° C.) of tetramethylammonium hydroxide (TMAH), and then rinsed in pure water for 30 seconds, thus forming a line and space (L/S) pattern.

The exposure dose Eop ($\mu C/cm^2$) at which a 100 nm L/S pattern was formed in a 1:1 ratio was determined.

<Resolution>

The critical resolution (nm) at the above Eop value was determined using a scanning electron microscope S-9220 (manufactured by Hitachi, Ltd.).

<Surface Roughness>

Each positive resist composition solution was applied uniformly, using a spinner, to the surface of an 8-inch silicon substrate that had been treated with hexamethyldisilazane, and was then subjected to a bake treatment (PAB) at 110° C. for 90 seconds, thus forming a resist film (film thickness: 160 nm).

This resist film was exposed with an electron beam lithography apparatus HL-800D (VSB) (manufactured by Hitachi Ltd.) using an accelerating voltage of 70 kV and an exposure dose of 10 $\mu C/cm^2$, subsequently subjected to a bake treatment (PEB) at 110° C. for 90 seconds, and was then developed in a 2.38% by weight aqueous solution of TMAH (23° C.), using a developing time that resulted in a film thickness following developing that was approximately 50% of the initial film thickness (60 seconds in the example 1, and 15 seconds in the comparative example 1), and then rinsed in pure water for 30 seconds.

Following rinsing, the surface of the resist film was inspected using an AFM (atomic force microscope: di NanoScope IV/D5000, manufactured by Veeco Instruments Inc.), and the root mean squared roughness Rms (nm) per square $\mu m$ was determined.

TABLE 4

|  | Sensitivity | Resolution | Surface roughness |
|---|---|---|---|
| Example 1 | 16 $\mu C/cm^2$ | 70 nm | 6.2 nm |
| Comparative example 1 | 30 $\mu C/cm^2$ | 70 nm | 22.9 nm |

As is evident from the above results, the positive resist composition of the example 1 that used the compound (2) exhibited a high level of resolution, and a very low level of surface roughness. The fact that the surface roughness was low suggests that roughness on the pattern side walls (LER) during resist pattern formation will also have been reduced. Furthermore, the sensitivity was also excellent.

In contrast, although the comparative example 1 that used the resin (3) exhibited a high level of resolution, the surface roughness was extremely large. Furthermore, the sensitivity was also poor.

INDUSTRIAL APPLICABILITY

The present invention provides a positive resist composition and a method for resist pattern formation that are capable of forming a high resolution resist pattern with a reduced level of roughness, and also provides a compound that is ideal for use within the positive resist composition.

What is claimed is:

1. A positive resist composition, comprising:
   a base material component (A) that contains an acid-dissociable, dissolution-inhibiting group and exhibits increased alkali solubility under action of acid; and
   an acid generator component (B) that generates acid upon exposure, wherein
   said base material component (A) contains a compound (A1), in which either a portion of, or all of, hydrogen atoms of phenolic hydroxyl groups within a polyhydric phenol compound, which has two or more phenolic hydroxyl groups, a molecular weight of 300 to 2,500, and is represented by a general formula (I) shown below, have been substituted with an acid-dissociable, dissolution-inhibiting group (II) represented by a general formula (II) shown below:

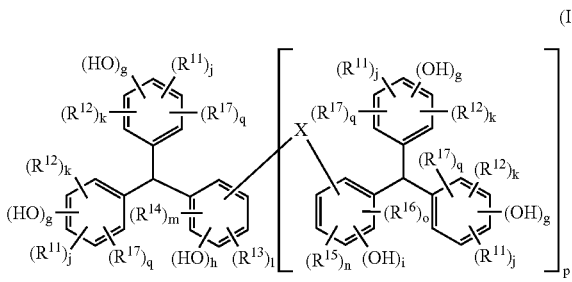

[wherein, $R^{11}$ to $R^{17}$ each represent, independently, an alkyl group of 1 to 10 carbon atoms or an aromatic hydrocarbon group, which may include a hetero atom within a structure thereof; g and j each represent, independently, an integer of 1 or greater, and k and q each represent, independently, either 0 or an integer of 1 or greater, provided that g+j+k+q is no greater than 5; h represents an integer of 1 or greater, and l and m each represent, independently, either 0 or an integer of 1 or greater, provided that h+l+m is no greater than 4; i represents an integer of 1 or greater, and n and o each represent, independently, either 0 or an integer of 1 or greater, provided that i+n+o is no greater than 4; p represents 1; and X represents a group represented by a general formula (Ia) shown below]:

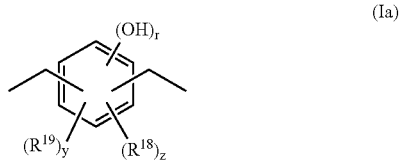

[wherein, $R^{18}$ and $R^{19}$ each represent, independently, an alkyl group of 1 to 10 carbon atoms or an aromatic hydrocarbon group, which may include a hetero atom within a structure thereof; and r, y and z each represent, independently, either 0 or an integer of 1 or greater, provided that r+y+z is no greater than 4];

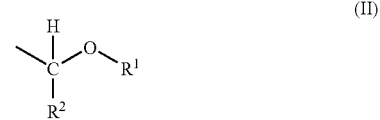

[wherein, $R^1$ represents a straight-chain lower alkyl group of 1 to 5 carbon atoms, which may include a hetero atom within a structure thereof; and $R^2$ represents a hydrogen atom or a lower alkyl group of 1 to 5 carbon atoms].

2. A positive resist composition according to claim 1, further comprising: a nitrogen-containing organic compound (D).

3. A method for resist pattern formation, comprising the steps of:
   forming a resist film on a substrate using a positive resist composition according to claim 1;
   conducting exposure of said resist film; and
   developing said resist film to form a resist pattern.

4. A method for resist pattern formation, comprising the steps of:
   forming a resist film on a substrate using a positive resist composition according to claim 2;
   conducting exposure of said resist film; and
   developing said resist film to form a resist pattern.

5. A compound, wherein either a portion of, or all of, hydrogen atoms of phenolic hydroxyl groups within a polyhydric phenol compound, which has two or more phenolic hydroxyl groups, a molecular weight of 300 to 2,500, and is represented by a general formula (I) shown below, have been substituted with an acid-dissociable, dissolution-inhibiting group (II) represented by a general formula (II) shown below:

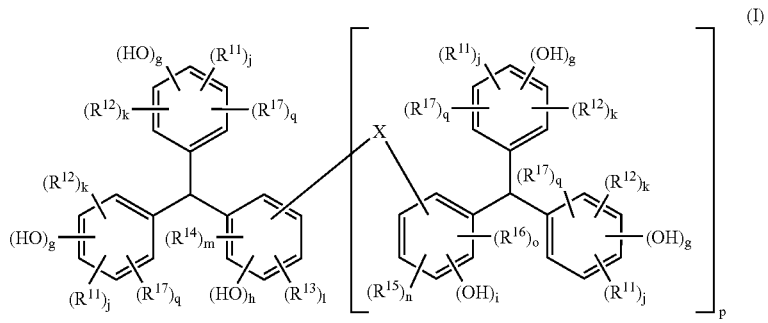

[wherein, $R^{11}$ to $R^{17}$ each represent, independently, an alkyl group of 1 to 10 carbon atoms or an aromatic hydrocarbon group, which may include a hetero atom within a structure thereof; g and j each represent, independently, an integer of 1 or greater, and k and q each represent, independently, either 0 or an integer of 1 or greater, provided that g+j+k+q is no greater than 5; h represents an integer of 1 or greater, and l and m each represent, independently, either 0 or an integer of 1 or greater, provided that h+l+m is no greater than 4; i represents an integer of 1 or greater, and n and o each represent, independently, either 0 or an integer of 1 or greater, provided that i+n+o is no greater than 4; p represents 1; and X represents a group represented by a general formula (Ia) shown below]:

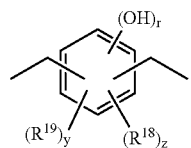

(Ia)

[wherein, $R^{18}$ and $R^{19}$ each represent, independently, an alkyl group of 1 to 10 carbon atoms or an aromatic hydrocarbon group, which may include a hetero atom within a structure thereof and r, y and z each represent, independently, either 0 or an integer of 1 or greater, provided that r+y+z is no greater than 4];

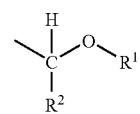

(II)

[wherein, $R^1$ represents a straight-chain lower alkyl group of 1 to 5 carbon atoms, which may include a hetero atom within a structure thereof; and $R^2$ represents a hydrogen atom or a lower alkyl group of 1 to 5 carbon atoms].

* * * * *

UNITED STATES PATENT AND TRADEMARK OFFICE
CERTIFICATE OF CORRECTION

PATENT NO. : 7,504,196 B2 Page 1 of 1
APPLICATION NO. : 11/884748
DATED : March 17, 2009
INVENTOR(S) : Shiono et al.

It is certified that error appears in the above-identified patent and that said Letters Patent is hereby corrected as shown below:

Title Page;
Page 1, item (75) Inventors:, delete "Daju Shiono," and insert -- Daiju Shiono, --, therefore.

Signed and Sealed this

Fourth Day of August, 2009

JOHN DOLL
*Acting Director of the United States Patent and Trademark Office*